United States Patent
Yano et al.

(10) Patent No.: US 7,362,620 B2
(45) Date of Patent: Apr. 22, 2008

(54) SEMICONDUCTOR DEVICE AND METHOD OF CONTROLLING THE SAME

(75) Inventors: Masaru Yano, Kawasaki (JP); Hideki Arakawa, Kawasaki (JP); Mototada Sakashita, Kawasaki (JP)

(73) Assignee: Spansion LLC, Sunnyvale, CA (US)

( * ) Notice: Subject to any disclaimer, the term of this patent is extended or adjusted under 35 U.S.C. 154(b) by 182 days.

(21) Appl. No.: 11/394,491

(22) Filed: Mar. 31, 2006

(65) Prior Publication Data

US 2006/0245247 A1    Nov. 2, 2006

Related U.S. Application Data

(63) Continuation of application No. PCT/JP2005/006310, filed on Mar. 31, 2005.

(51) Int. Cl.
G11C 7/00    (2006.01)
(52) U.S. Cl. ............... 365/189.05; 365/189.01; 365/203
(58) Field of Classification Search .......... 365/189.05, 365/189.01, 203
See application file for complete search history.

(56) References Cited

U.S. PATENT DOCUMENTS

| | | | |
|---|---|---|---|
| 5,844,843 A * | 12/1998 | Matsubara et al. | .... 365/185.24 |
| 6,011,725 A | 1/2000 | Eitan | |
| 6,038,166 A * | 3/2000 | Wong | .......... 365/185.03 |
| 6,671,204 B2 | 12/2003 | Im | |
| 2003/0016559 A1 | 1/2003 | Kawai et al. | |
| 2003/0016562 A1 | 1/2003 | Im | |
| 2003/0058691 A1 | 3/2003 | Cemea | |
| 2003/0156455 A1 | 8/2003 | Nakamura et al. | |

FOREIGN PATENT DOCUMENTS

| | | |
|---|---|---|
| EP | 1280161 | 1/2003 |
| JP | 62162299 | 7/1987 |
| JP | 5298894 | 11/1993 |
| JP | 7240098 | 9/1995 |
| JP | 11003594 | 1/1999 |

(Continued)

OTHER PUBLICATIONS

E. Maayan, et al. "Digest of Technical Papers" A 512 Mb NROM flash data storage memory with 8 MB/s data rate, pp. 100-101, Feb. 2002.

*Primary Examiner*—Son Dinh
(74) *Attorney, Agent, or Firm*—Ingrassia Fisher & Lorenz, P.C.

(57) ABSTRACT

A semiconductor device (1) includes a non-volatile memory cell array (2), a write/read circuit (30) writing data into and reading data from the non-volatile memory cell array (2), a data input/output circuit (80), and a volatile memory cell array (40) including a first latch circuit (41) that is connected to the write/read circuit (30) and latches first data, and a second latch circuit (42) that is connected to the data input/output circuit (80) and latches second data. The device (1) may further include an inverter circuit (310) that inverts the first data in accordance with the number of bits to be actually written among the first data, and a control circuit (3) that causes the second data to be latched in the second latch circuit (42) while the first data is being written into the non-volatile memory cell array (2). This semiconductor device (1) has a shorter writing time and a smaller circuit area.

26 Claims, 11 Drawing Sheets

FOREIGN PATENT DOCUMENTS

| | | |
|---|---|---|
| JP | 2003030993 | 1/2003 |
| JP | 2003151291 | 5/2003 |
| JP | 2003249082 | 9/2003 |
| JP | 2004179626 | 6/2004 |
| JP | 2004265483 | 9/2004 |
| JP | 2005504404 T | 2/2005 |

* cited by examiner

SEMICONDUCTOR DEVICE AND METHOD OF CONTROLLING THE SAME

CROSS-REFERENCES TO RELATED APPLICATIONS

This is a continuation of International Application No. PCT/JP2005/06310, filed Mar. 31, 2005 which was not published in English under PCT Article 21(2).

BACKGROUND OF THE INVENTION

1. Field of the Invention

The present invention generally relates to a semiconductor device and a method of controlling such semiconductor device.

2. Description of the Related Art

A NAND flash memory collectively performs write and read by "pages" (by two kilbyte (Kbyte) pages, for example). When writing, the data of one page is input from an I/O terminal (sixteen bits wide) to a page buffer in a serial fashion. In the page buffer, the latch circuits for one page are prepared for latching program data. When the data latch into the page buffer transfer is completed, programming is performed simultaneously on the subject memory cells. When reading, data is read in from the memory cells of one page, and the read data is collectively latched into the latch circuits in the page buffer. The read data is then output from the I/O terminal in a serial fashion under the control of an external device (a toggle operation of a terminal/RE pin, for example).

For high-speed writing operations, a cache programming mode has recently been suggested. In this mode, while memory cells are being programmed with write data latched in a page buffer, new write data is loaded from outside into the cache latch circuits for one page. As soon as the previous programming is completed, programming is performed with the new write data. Accordingly, the required data loading time can be shortened. Also, a copy-back mode has been suggested. In this mode, the data of one page stored in memory cells is read into a page buffer, and is written into another page with a different address. As the data read into the page buffer is not output to the outside and the copying operation is automatically performed inside, the operation time can be shortened.

Further, in this mode, new write data from outside is input into the page buffer when the cell data is read into the page buffer. Another page is then programmed with the overwritten new data (see U.S. Pat. No. 6,671,204 (Patent Document 1)).

In a conventional NAND flash memory, information is recorded by injecting charges into a floating gate made of polycrystalline silicon. Since a control gate is made of polycrystalline silicon, this flash memory is manufactured by a polysilicon double-layer process. Such memory cells are connected in series to form an array structure. In this structure, writing is performed through FN tunneling caused by generating a high potential between the control gates of each cell and the substrate.

In recent years, there have been flash memories with SONOS (semiconductor-oxide-nitride-oxide-semiconductor) cells that record information by trapping charges in a nitride film instead of a floating gate. Since each of the flash memories with this structure can be manufactured by a polysilicon one-layer process, the production costs are lower. Also, as the flash memories of this type can form a virtually grounded array structure, a higher degree of cell integration can be achieved. The interface (I/F) with the outside is the same as that of a NOR flash memory, and writing is performed through hot electron injection caused by applying a high voltage to the drain and the control gate of each subject cell (see U.S. Pat. No. 6,011,725 (Patent Document 2)).

Japanese Unexamined Patent Publication Nos. 5-298894 and 62-162299 (Patent Document 3 and Patent Document 4, respectively) also disclose techniques for faster writing operations. By either of the techniques, if the number of "0" bits (in a written state) among input data is larger than a predetermined number, the input data is inverted and then written in memory cells and flag data indicating that the input data is inverted is also written in the memory cells.

Non-Patent Document 1 ("A 512 Mb NROM flash data storage memory with 8 MB/s data rate", E. Maayan, et al., Digest of Technical Papers, pp. 100-101, February 2002) has disclosed a flash memory having SONOS cells and a NAND I/F. In this document, a Static Random Access Memory (SRAM) that latches the data of one page (528 bytes in this disclosure) is disclosed. However, specific structures and operations are not disclosed in the document. Also, there is not a description of a cache program or a copy-back operation.

A flash memory having SONOS cells and a conventional NOR flash memory additionally has the following drawbacks. Since writing is performed through hot electron injection, the current consumption is greater than that of a NAND flash memory. Also, since the number of bits that can be programmed at one time is as small as several tens, the programming speed is low.

In a conventional NAND flash memory, on the other hand, two Kbyte cells can be programmed at once because the writing is performed through FN tunneling. However, a page buffer circuit that can cope with such high-speed programming is required, resulting in a large circuit size.

SUMMARY OF THE INVENTION

It is an object of the present invention to provide a semiconductor device and a method of controlling the semiconductor device in which the above disadvantages are eliminated. A more specific object of the present invention is to provide a semiconductor device that requires a shorter writing time and has a smaller circuit area, and a method of controlling such semiconductor device.

The above object of the present invention is achieved by a semiconductor device that includes a non-volatile memory cell array, a write/read circuit writing data into and reading data from the non-volatile memory cell array, a data input/output circuit, and a volatile memory cell array including a first latch circuit that is connected to the write/read circuit and latches first data, and a second latch circuit that is connected to the data input/output circuit and latches second data. In accordance with the present invention, the latch circuits for storing data are formed in an array. Accordingly, the circuit size can be made smaller, and cache programming or a copy-back operation can be performed.

The semiconductor device in accordance with the present invention further includes an inverting circuit that inverts the first data in accordance with the number of bits to be actually programmed among the first data at the time of writing. In accordance with the present invention, the number of bits to be actually programmed can be restricted to a predetermined number or smaller. Accordingly, a NAND I/F that can shorten the writing time can be achieved. Also, the circuit area can be reduced. The semiconductor device in accordance with the present invention further includes a control circuit that controls the second latch circuit to latch the second data while the non-volatile memory cell array is being programmed with the first data. Accordingly, cache programming can be performed. The semiconductor device in accordance with the present invention further includes a control circuit that performs a control operation using the first latch circuit and the second latch circuit, so that data read out from a region in the non-volatile memory cell array is written onto another region in the non-volatile memory cell array. Accordingly, a copy-back operation can be performed.

The semiconductor device in accordance with the present invention further includes a control circuit that performs a control operation using the first latch circuit and the second latch circuit to overwrite data that is read out from the non-volatile memory cell array with write data that is supplied from outside, and to write the overwritten data into the non-volatile memory cell array. Thus, an over-writable copy-back operation can be performed. The semiconductor device in accordance with the present invention further includes a detecting circuit that detects the number of bits to be actually programmed among the first data at the time of writing, a comparator circuit that compares the number of bits detected by the detecting circuit with a predetermined bit number, and an output circuit that outputs a flag indicating whether the first data is to be inverted in accordance with the comparison result of the comparator circuit.

The non-volatile memory cell array includes a region for storing a flag indicating whether the first data has been inverted and written in accordance with the number of bits to be actually programmed among the first data at the time of writing. The semiconductor device in accordance with the present invention further includes an inverting circuit that inverts data read out from the non-volatile memory cell array in accordance with a flag indicating whether the first data has been inverted and written based on the number of bits to be actually programmed among the first data at the time of reading. The volatile memory cell array further includes a sense amplifier circuit for precharging a bit line in the first latch circuit.

The volatile memory cell array further includes a sense amplifier circuit for precharging a bit line in the second latch circuit. The semiconductor device in accordance with the present invention further includes a decoder that is associated with the volatile memory cell array. The volatile memory cell array further includes a switch for controlling data transfer between the first latch circuit and the second latch circuit.

Prior to data transfer between the first latch circuit and the second latch circuit, the first latch circuit or the second latch circuit (whichever is a transfer destination) is reset to a predetermined state. The first latch circuit and the second latch circuit in the volatile memory cell array are equivalent to one page. The volatile memory cell array includes a region for storing a flag indicating whether the first data has been inverted and written in accordance with the number of bits to be actually programmed among the first data at the time of writing.

The volatile memory is an SRAM. The non-volatile memory cell array includes a SONOS-type cell. The non-volatile memory cell array includes a cell to be programmed through hot electron injection. With this structure, even if only a small number of bits in the memory can be simultaneously programmed through hot electron injection, the writing time can be shortened.

The above objects of the present invention are also achieved by a method of controlling a semiconductor device comprising the steps of loading first data into a first latch circuit in a volatile memory cell array, inverting the first data in accordance with the number of bits to be actually programmed among the first data, writing the inverted data into a non-volatile memory cell array, and loading second data into a second latch circuit in the volatile memory cell array. In accordance with the present invention, the latch circuits for storing data are formed in an array. Accordingly, the circuit area can be reduced, and cache programming or a copy-back operation can be performed.

The method in accordance with the present invention further includes the step of inverting the first data in accordance with the number of bits to be actually programmed among the first data at the time of writing. In accordance with the present invention, the number of bits to be actually programmed can be restricted to a predetermined number or smaller. Accordingly, a NAND I/F that can shorten the writing time can be achieved. Also, the circuit area can be reduced.

The second data is loaded into the second latch circuit while the non-volatile memory cell array is being programmed with the first data. Accordingly, cache programming can be performed. The method of the present invention further includes the step of writing data that is read out from a region in the non-volatile memory cell array into another region in the non-volatile memory cell array, using the first latch circuit and the second latch circuit. Thus, a copy-back operation can be performed.

The method in accordance with the present invention further includes the step of overwriting data that is read out from the non-volatile memory cell array with write data that is supplied from outside, and writing the overwritten data into the non-volatile memory cell array. Accordingly, an over-writable copy-back operation can be performed. The method in accordance with the present invention further includes the steps of dividing the first data, detecting the number of bits to be actually programmed among the divided data, and outputting a flag indicating whether the first data is to be inverted in accordance with the detected number of bits. The method in accordance with the present invention further includes the step of inverting data that is read out from the non-volatile memory cell array in accordance with the number of bits to be programmed.

As described above, the present invention can provide a semiconductor device that requires a shorter writing time and a smaller circuit area, and a method of controlling such semiconductor device to provide such advantages.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of embodiments of the present invention, with reference to the accompanying drawings. In the following description, a flash memory having a NAND I/F formed with SONOS-type memory cells will be described. The features described below are applicable not only to SONOS-type cell arrays but also to FG-type cell arrays.

Figure 1:
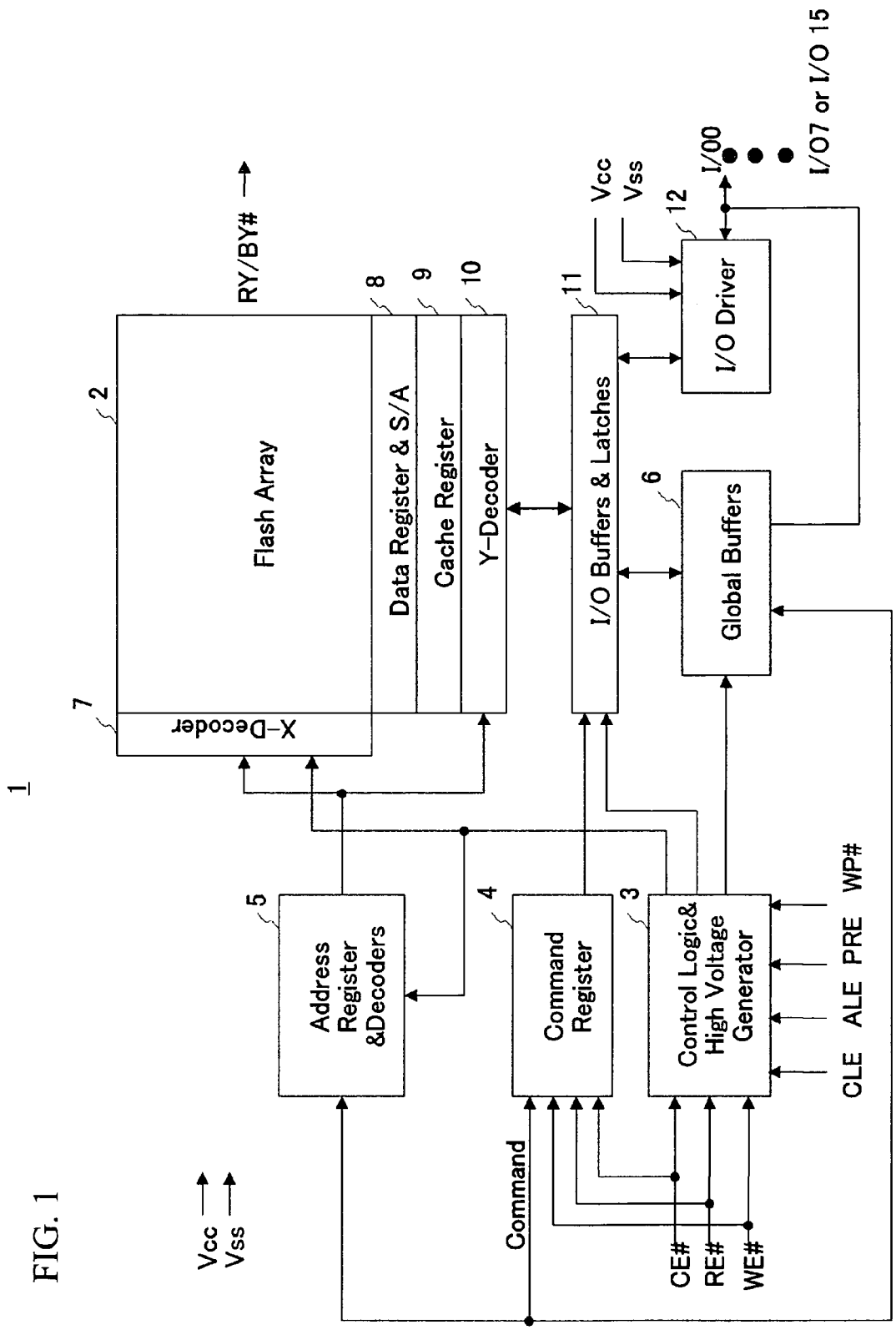
FIG. 1 is a block diagram of a flash memory.

FIG. 1 is a block diagram of a flash memory 1. The flash memory 1 includes a memory cell array 2, a state machine and high-voltage generating circuit 3, a command register 4, an address register and decoder 5, a global buffer 6, an X-decoder 7, a data register and sense amplifier 8, a cache register 9, a Y-decoder 10, an I/O buffer and latch circuit 11, and an input/output driver 12.

The memory cell array 2 includes rewritable non-volatile memory cells that are arranged along word lines WL and bit lines BL in a matrix fashion. Each of the memory cells is a cell wherein the write function is performed through hot electron injection. In this embodiment, SONOS-type cells are employed as the non-volatile memory cells. The state machine 3 controls the operation of each circuit in the device in response to each control signal. The high-voltage generating circuit 3 generates high voltages that are used within the device. The high voltages used within the device include a high voltage for writing data, a high voltage for erasing data, a high voltage for reading data, and a verifying high voltage for checking whether sufficient write/erase has been performed on a subject memory cell at the time of writing or erasing data.

The command register 4 temporarily stores operation commands that are input through the global buffer 6. The address register and decoder 5 temporarily stores input address signals.

The data register and sense amplifier 8 corresponds to a WR sense amplifier blocks 30 and a SRAM array 40 that will be described later in conjunction with FIG. 2. The cache register 9 corresponds to the SRAM array 40 described later. And the Y-decoder 10 corresponds to a Y-sel 72 that will be described later. The I/O buffer and latch circuit 11 controls various signals or data corresponding to I/O terminals. The input/output driver 12 controls the data to be output from the flash memory 1 and the data to be input thereto.

Figure 2:
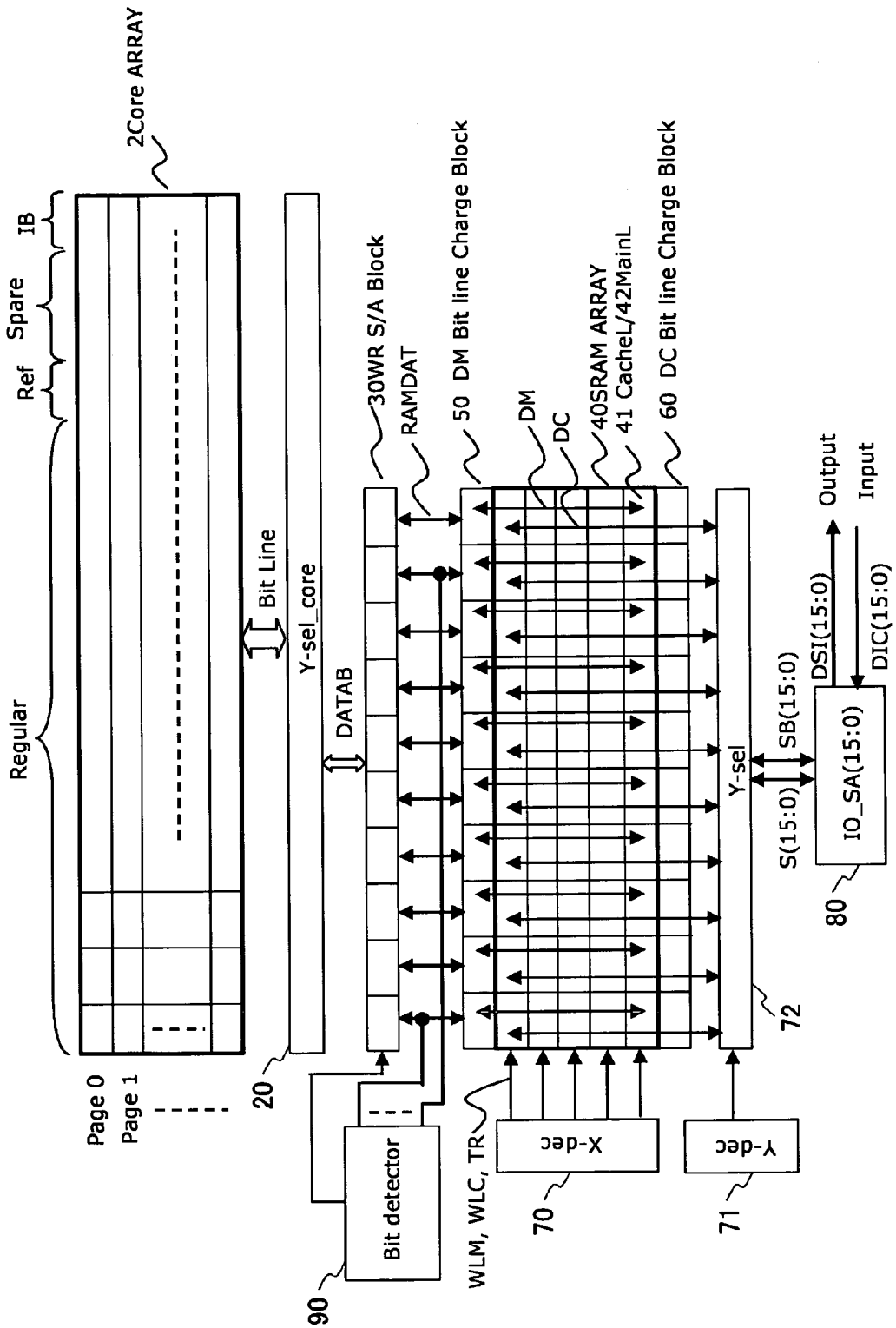
FIG. 2 is a block diagram of a flash memory structure in accordance with an embodiment of the present invention.

FIG. 2 is a block diagram illustrating a flash memory 1 structure in accordance with an embodiment of the present invention. A core array 2 includes one or more regions equivalent to one page, which includes a regular memory region (Regular), a reference memory region (Ref), a spare memory region (Spare), and an indicator bit region (IB: Indicator Bit). The indicator bit is a flag that indicates whether first data has been inverted and written in accordance with the number of bits from among the first data to be actually written at the time of writing. The reference memory region (Ref) contains a cell to generate a comparative current at the time of sensing. The spare memory region (Spare) contains memory cells to store file management data or the like. A block containing several pages forms an erase unit, and several blocks (not shown) are formed within the core array 2.

Y-sel_core 20 is connected to the core array 2 via bit lines, and is a circuit to select a predetermined bit unit among the data of one page, the predetermined bit unit containing 536 bits, for example, and hereinafter referred to as the internal access window and where one page is a constant k (such as thirty-two) by an internal data width (such as the predetermined bit unit of 536 bits). Among the 536 bits, 512 bits are allotted to the regular memory region, 4 bits are allotted to the indicator bit region, 16 bits are allotted to the spare region, and 4 bits are allotted to the reference memory region. A WR sense amplifier block 30 includes a write/read circuit that performs write and read on the memory cell array 2 and is connected to a line DATAB having an internal data width equivalent to the predetermined bit unit (e.g., 536 bits). The WR sense amplifier block 30 also includes circuits such as a sense amplifier to be used for reading data, a WR latch circuit that latches data for programming, and a WR buffer that charges the line DATAB based on the data latched by the WR latch circuit.

The SRAM array 40 is a volatile memory cell array and includes main latch circuits 42 that are connected to the WR sense amplifier blocks 30 and hold the first data, and cache latch circuits 41 that are connected to an IO_SA(15:0) circuit 80 and hold second data. The cache latch circuits 41 and the main latch circuits 42 are formed with the SRAM cells. The SRAM array 40 has one page of cache latch circuits 41 and main latch circuits 42 arranged in an array. In the SRAM array 40, there is also a regular memory region (Regular) a reference memory region (Ref), a spare region (Spare), and an indicator bit region (IB), in conformity with the arrangement in the core array 2. The SRAM array 40 further includes a DM bit-line charge block 50 and a DC bit-line charge block 60. X-decoder 70 and Y-decoder 71/Y-select 72 are decoders for the SRAM array 40.

The cache latch circuits 41 and the main latch circuits 42 are aligned transversely in accordance with the number of internal access windows. Among the cache latch circuits 41 equivalent to the number of internal access windows, only the external I/O bus width (16 bits) is selected and is connected to the S/A(15:0) 80.

The DM bit-line charge block 50 includes sense amplifier circuits that precharge the bit lines in the main latch circuits 42. The DM bit line charge block 50 precharges the bit lines DM of the main latch circuits 42, performs data sensing, and controls data transfer between the WR sense amplifier blocks 30 and the SRAM array 40. As will be described later in connection with FIG. 4, each WR sense amplifier block 30 includes a WR latch circuit 31 (i.e., a data latch circuit for writing and reading), a cascode amplifier 32, a differential amplifying sense amplifier 33, and a write amplifier circuit 34. The WR sense amplifier blocks 30 are connected to the DM bit-line charge blocks 50 via lines RAMDAT, and are further connected to the core array 2 via the Y-sel_core 20.

A bit detector 90 is a circuit that counts 0s (program data that is input from external to the flash memory 1) existing in the data on the lines RAMDAT, and controls the WR sense amplifier blocks 30 based on the count result. The DC bit-line charge block 60 includes sense amplifier circuits that precharge or sense the bit lines DC of the cache latch circuits 41. The DC bit-line charge block 60 is connected to the Y-select 72. The IO_SA(15:0) circuit 80 is a data input/output circuit that amplifies data that is selected from the cache latch circuits 41 by the Y-select 72, and transfers such data to an external I/O terminal. Alternatively, the IO_SA (15:0) circuit 80 amplifies data that is input from an external I/O terminal, and transfers such data to the Y-select 72.

Figure 3:
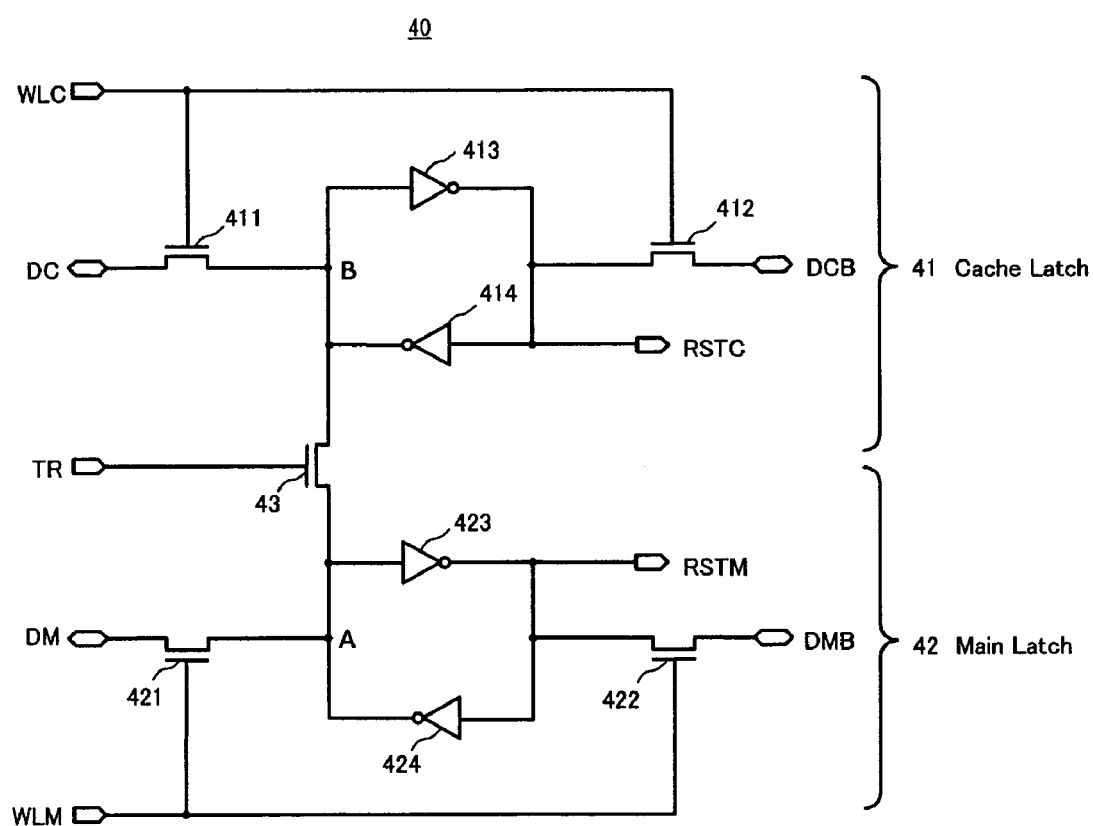
FIG. 3 shows a cache latch circuit and a main latch circuit in the SRAM array of FIG. 2 in accordance with the embodiment of the present invention.

Next, the structure of each circuit is described. FIG. 3 shows a cache latch circuit 41 and a main latch circuit 42 in the SRAM array 40 in accordance with the embodiment of the present invention. As shown in FIG. 3, the cache latch circuit 41 includes NMOS transistors 411 and 412, and inverters 413 and 414. The main latch circuit 42 includes NMOS transistors 421 and 422, and inverters 423 and 424. The cache latch circuit 41 and the main latch circuit 42 are selected through a word line WLC and a word line WLM, respectively. The bit line and the complementary bit line of the cache latch circuit 41 are denoted by DC and DCB, and the bit line and the complementary bit line of the main latch circuit 42 are denoted by DM and DMB. When the single word line WLC for cache latch is selected, the cache latch circuits 41 that are aligned in the transverse direction are collectively selected. When the single word line WLM for main latch is selected, the main latch circuits 42 that are aligned in the transverse direction are collectively selected.

As shown in FIG. 3, the cache latch circuit 41 and the main latch circuit 42 are connected to each other with a transfer transistor 43. When a signal TR is High, data is transferred from one latch circuit to the other. The transfer transistor (a switch) 43 controls data transfer between the cache latch circuit 41 and the main latch circuit 42. With a signal RSTM and a signal RSTC, each of the latch circuits is reset to a predetermined state. More specifically, the transfer transistor 43 is formed with a NMOS transistor, and resets nodes A and B to a High level. The nodes A and B are connected to the transfer transistor 43. For example, when a Low signal is input at the node A of the main latch circuit 42 through the bit line DM after resetting, the signal TR becomes High, and the node B reset to a High level is pulled down with respect to the node A set to a Low level. As a result, the potential at the node B is changed to Low. In other words, the data on the node A is transferred to the node B. On the other hand, when a High signal is input at the node A after resetting, the node B is maintained at a High level after the transfer, having been originally reset to a High level. The cache latch circuits 41 and the main latch circuits 42 are arranged in the transverse direction in compliance with the number of internal access windows, and are also arranged in k lines (32 lines, for example) in the vertical direction. In total, the cache latch circuits 41 and the main latch circuits 42 equivalent to one page (two Kbytes) are provided.

As for external I/F, both writing and reading is performed page by page. However, for internal operations, write data is divided by the number of internal access windows, the data is set in accordance with the write amplifier circuit 34 (see FIG. 4), and a write voltage is applied. For the cells of one page, setting of the write amplifier circuit 34 is successively performed k times (32 times, for example). At the time of reading, the cascode amplifier 32 and the differential amplifier 33 k times successively sets data to the SRAM array 40, with the data being divided by the number of internal access windows.

Figure 4:
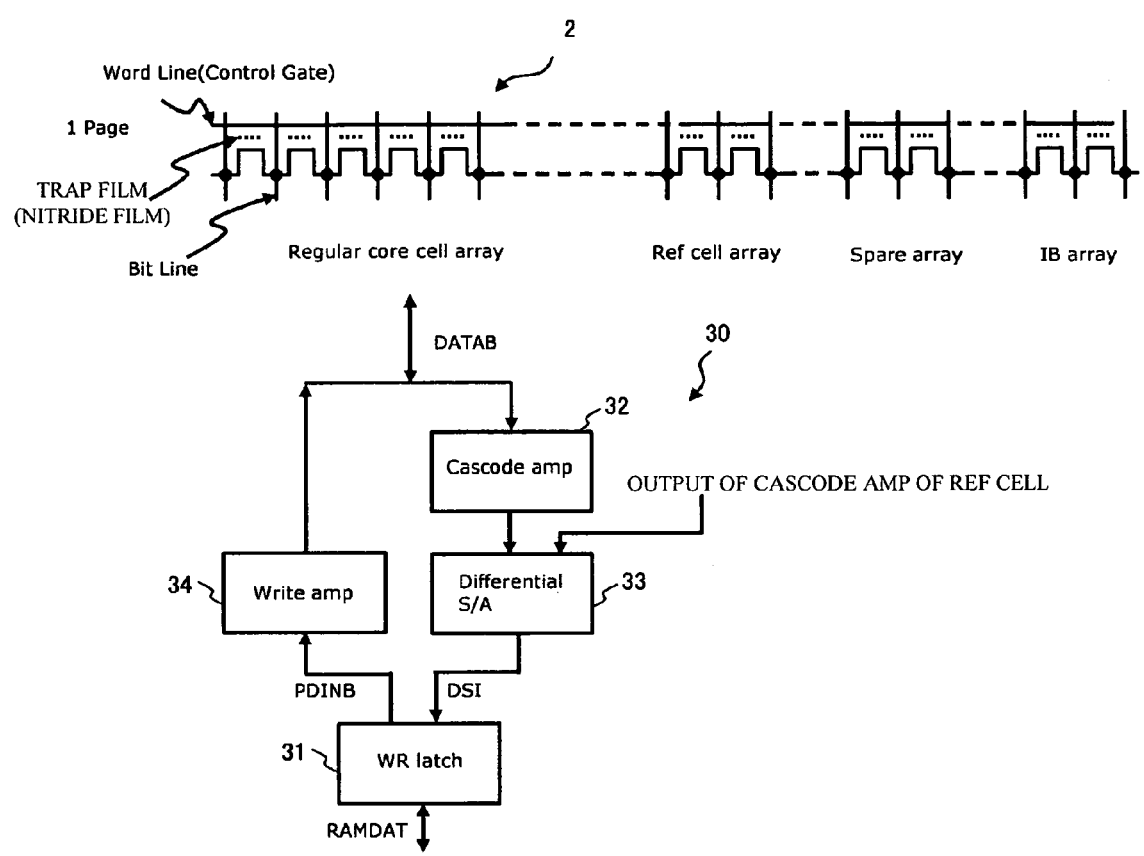
FIG. 4 shows a circuit block of one bit in the WR sense amplifier block of FIG. 2 in accordance with the embodiment of the present invention.

FIG. 4 shows the circuit block of one bit in a WR sense amplifier block 30 in accordance with the embodiment of the present invention. As shown in FIG. 4, the WR sense amplifier block 30 includes the WR latch circuit 31, the cascode amplifier 32, the differential sense amplifier 33 and the write amplifier circuit 34. The number of WR sense amplifier blocks 30 employed in the flash memory 1 is equal to the number of internal access windows, and the WR sense amplifier blocks 30 are connected to the predetermined cells (536 bits, for example) in one page through the Y-sel_core 20. In accordance with the present invention, the cell array 2 is a virtually grounded structure in which each diffusion layer is shared as a source or a drain between two adjacent cells. The cell array 2 is connected to the cascode amplifier 32 via the line DATAB. The cascode amplifier 32 is a current-voltage converting circuit that converts a cell current into a voltage. The differential amplifier 33 is a sense amplifier that compares and amplifies voltages that are obtained by the cascode amplifier 32 converting the current of the regular cells and the current of the reference cells. The WR latch circuit 31 is connected to the corresponding line RAMDAT. The WR latch circuit 31 latches the sensing result at the time of reading, and also latches the write data at the time of writing.

Figure 5:
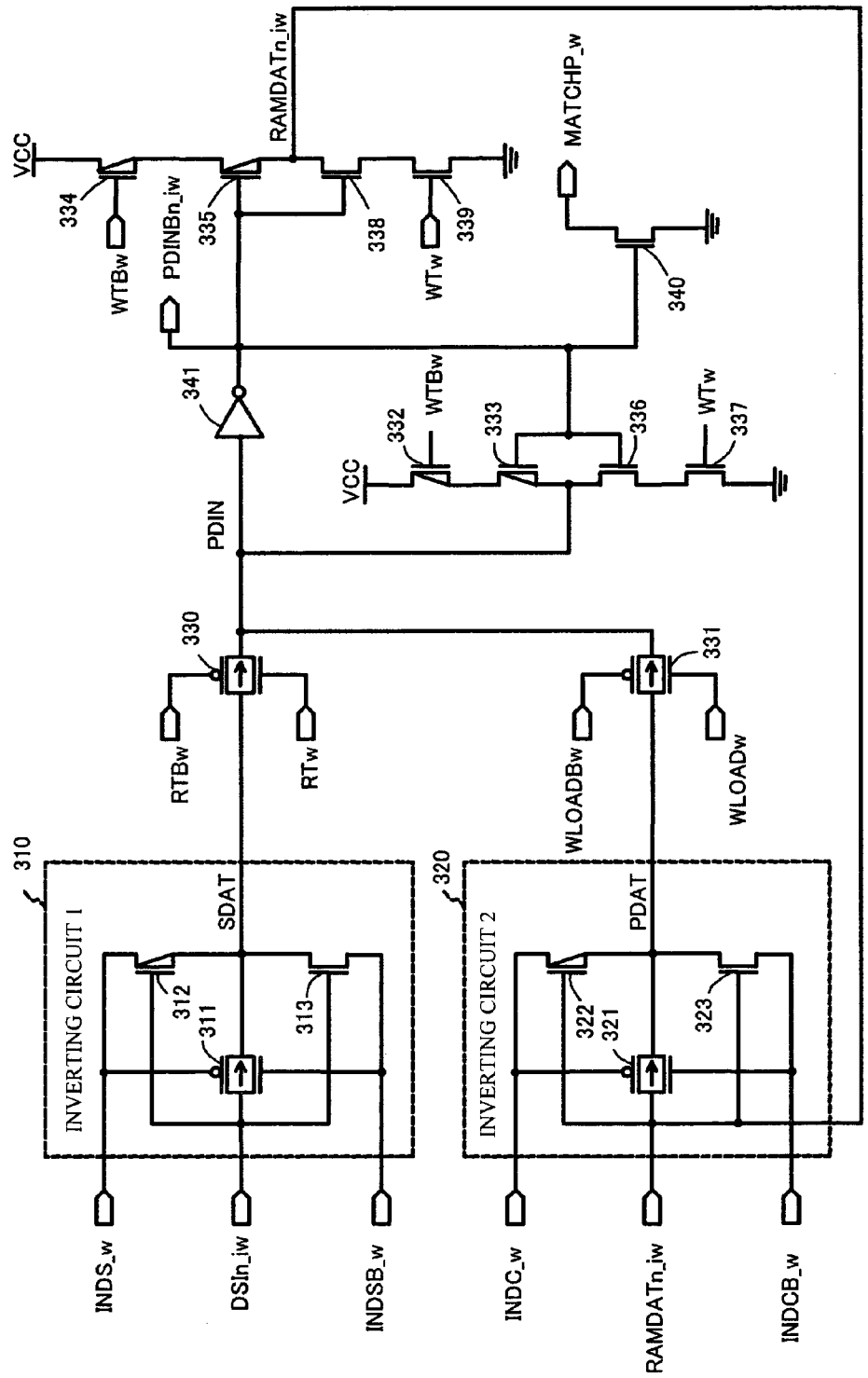
FIG. 5 illustrates a WR latch circuit of FIG. 4 in accordance with the embodiment of the present invention.

FIG. 5 illustrates the WR latch circuit 31 in accordance with the embodiment of the present invention. The WR latch circuit 31 includes inverting circuits 310 and 320, transfer gates 330 and 331 that are electrically connected to and separated from each other, NMOS transistors 336 through 340, PMOS transistors 332 through 335, and an inverter 341. The inverting circuit 310 is a circuit that inverts data read out from the memory cell array 2 in accordance with the indicator bit at the time of reading. The inverting circuit 310 includes a transfer gate 311, a PMOS transistor 312, and a NMOS transistor 313. In a case where the output of the sense amplifier circuit is transmitted from a terminal DSIn_iw and the data is inverted with signals INDS_w and INDSB_w activated in accordance with the information of the indicator bit at the time of reading, the inverted data is set to latch circuits PDIN and PDINBn_iw.

The inverting circuit 320 is a circuit that inverts the first data, at the time of writing, in accordance with the number of bits on which writing is to be actually performed among the first data held in the main latch circuit 42. The inverting circuit 320 includes a transfer gate 321, a PMOS transistor 322, and a NMOS transistor 323. In a case where write data is transmitted from a terminal RAMDATn_iw and the data is inverted with signals INDC_w and INDCB_w activated in accordance with the information of the indicator bit at the time of writing, the inverted data is set to the latch circuits PDIN and PDINBn_iw, and is output through the corresponding line RAMDAT. The line RAMDAT is connected to the sense amplifier circuit of the corresponding DM bit-line charge/main latch circuit. A signal WTw and a signal WTBw are activated to be connected to the corresponding line RAMDAT, and are then transmitted to the SRAM array 40.

The node PDINB controls the write amplifier circuit 34. In accordance with latched data, the node PDINB activates the write amplifier circuit 34, so as to apply a write voltage to the drains of the subject cells. For example, high-level data latched at the node PDINB indicates "write", and the write amplifier circuit 34 is triggered to output a high voltage to the corresponding line DATAB so that programming is performed on the subject cells through hot electron injection.

During a verifying operation to be performed after the write voltage application, sense data is input to the node PDINB via the corresponding line DSI. If the subject cells are properly programmed to exhibit "0"s, high-level verification data is latched at the node PDIN. If the data written on all the subject cells is "0"s, the latched data at the node PDINB is inverted from "High" to "Low". As a result, a signal MATCHP becomes "High" and indicates a verification pass. Thus, the programming is ended. The signal MATCHP is a node that is a pull up to VCC and has n-channel transistors that are "Wired OR" connected. The signals such as INDS and INDC will be described later.

Figure 6:
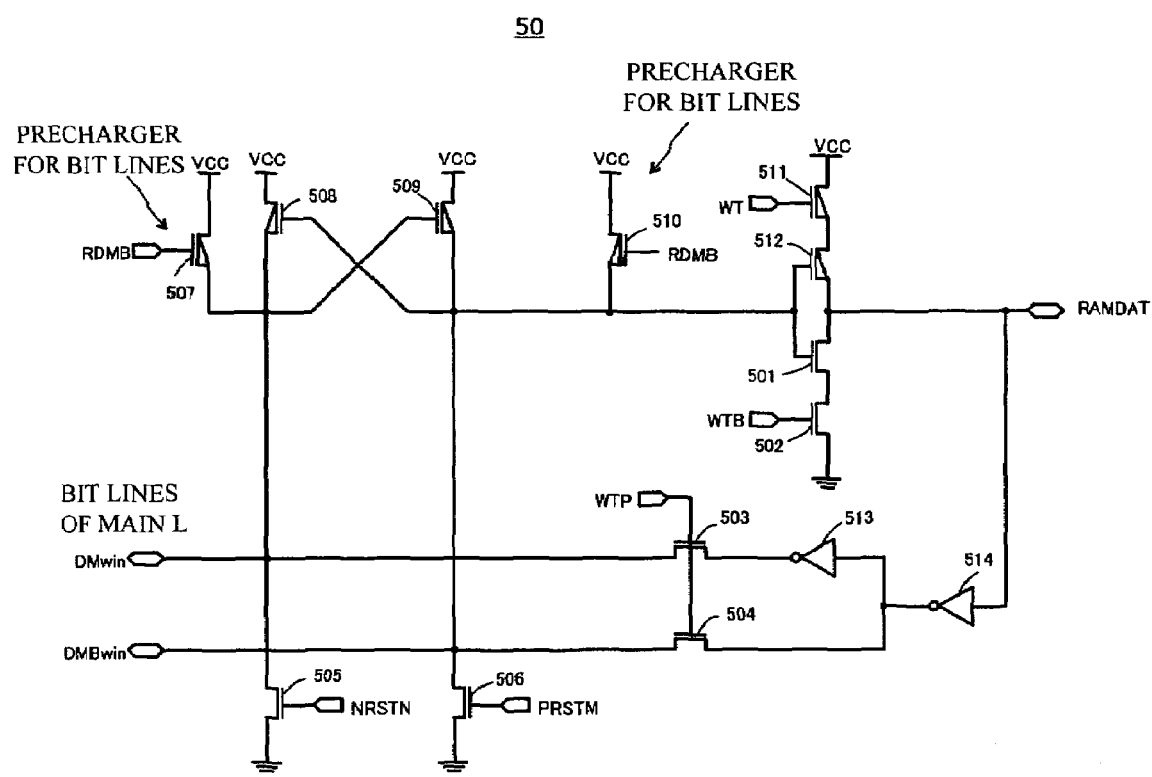
FIG. 6 illustrates a circuit structure of the DM bit-line charge block of FIG. 2 in accordance with the embodiment of the present invention.

FIG. 6 illustrates the circuit structure of the DM bit-line charge block 50 in accordance with the embodiment of the present invention. As shown in FIG. 6, the DM bit-line charge block 50 has a transfer controlling function to transmit sensed data from the differential sense amplifier 33 to the SRAM array 40 or to transmit data from the SRAM array 40 to the write amplifier circuit 34, an amplifying function to amplify the sensed data from the differential sense amplifier 33, and another amplifying function to amplify the data in the main latch circuits 42 (i.e., the sense amplifier for the main latch circuits).

The DM bit-line charge block 50 includes NMOS transistors 501 through 506, PMOS transistors 507 through 512, and inverters 513 and 514. The left half of the DM bit-line charge block 50 serves as the sense amplifier for the main latch circuits 42 of the SRAM array 40. Prior to the sensing, the DM bit-lint charge block 50 precharges the bit lines of the main latch circuits 42.

At the time of writing, write data that is held in the main latch circuits 42 of the SRAM array 40 are output to the lines RAMDAT via the DM bit-line charge block 50 for each internal access unit, and the write data is latched by the node PDINB of the WR latch circuit 31 as shown in FIG. 5. At the time of reading, the bit lines are precharged with a signal RDMB, and the nodes DM and DMB are set to VCC. A signal WTP is then set to a High level, and the bit lines DM and DMB of the main latch circuits 42 are driven with the sensed data that is input from the nodes RAMDAT. By doing so, the data is stored into the main latch circuits 42 of the SRAM array 40. Signals MRSTN and PRSTM are signals for forcibly resetting the data in the SRAM array 40.

Figure 7:
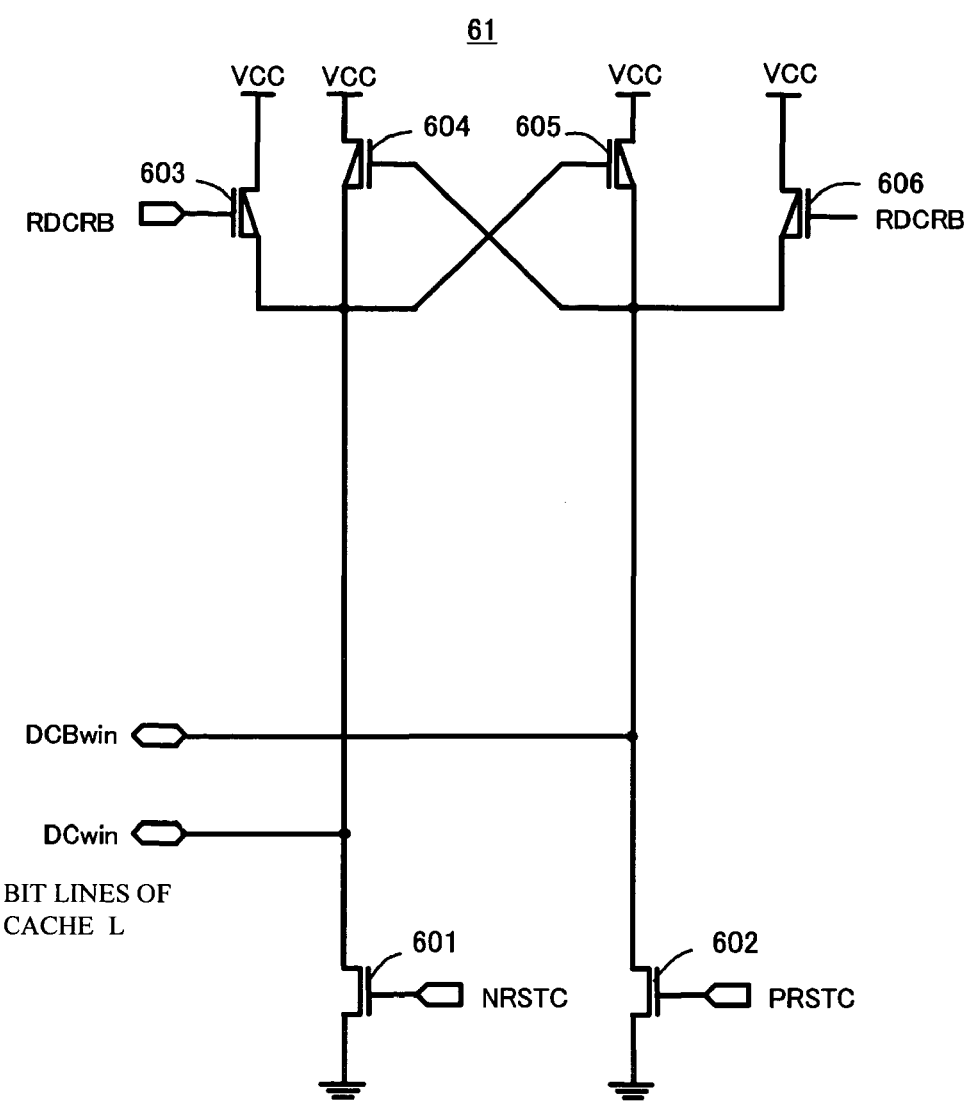
FIG. 7 is a circuit diagram of a sense amplifier for the cache latch circuits of the DC bit-line charge block of FIG. 2 in accordance with the embodiment of the present invention.

FIG. 7 illustrates the sense amplifier circuit of the cache latch circuit of the DC bit-line charge block 60 in accordance with the embodiment of the present invention. As shown in FIG. 7, the sense amplifier circuit 61 of the DC bit-line charge block 60 includes NMOS transistors 601 and 602, and PMOS transistors 603 through 606. The bit lines are precharged with a signal RDCRB. Signals NRSTC and PRSTC are signals for forcibly resetting the data in the SRAM array 40. At the time of writing, the write data that is input from external to the flash memory 1 via the Y-sel 72 is amplified, and is then transmitted to the cache latch circuits 41. At the time of reading, on the other hand, the data in the cache latch circuits 41 is amplified, and is then transmitted to the outside via the Y-select 72.

In the data transfer involving the cache latch circuits 41 and the main latch circuits 42, data from external to the flash memory 1 is latched in the cache latch circuits 41 and is then transferred from the cache latch circuits 41 to the main latch circuits 42. The data is at last written in the core array 2. On the other hand, data from the core array 2 is latched in the main latch circuits 42 and is then transferred from the main latch circuits 42 to the cache latch circuits 41. The data is at last output external to the flash memory 1. This data transfer path is of a series type. With this structure, the circuit size can be made smaller than the circuit that involves a multi-value page buffer as disclosed in Patent Document 1.

Figure 8:
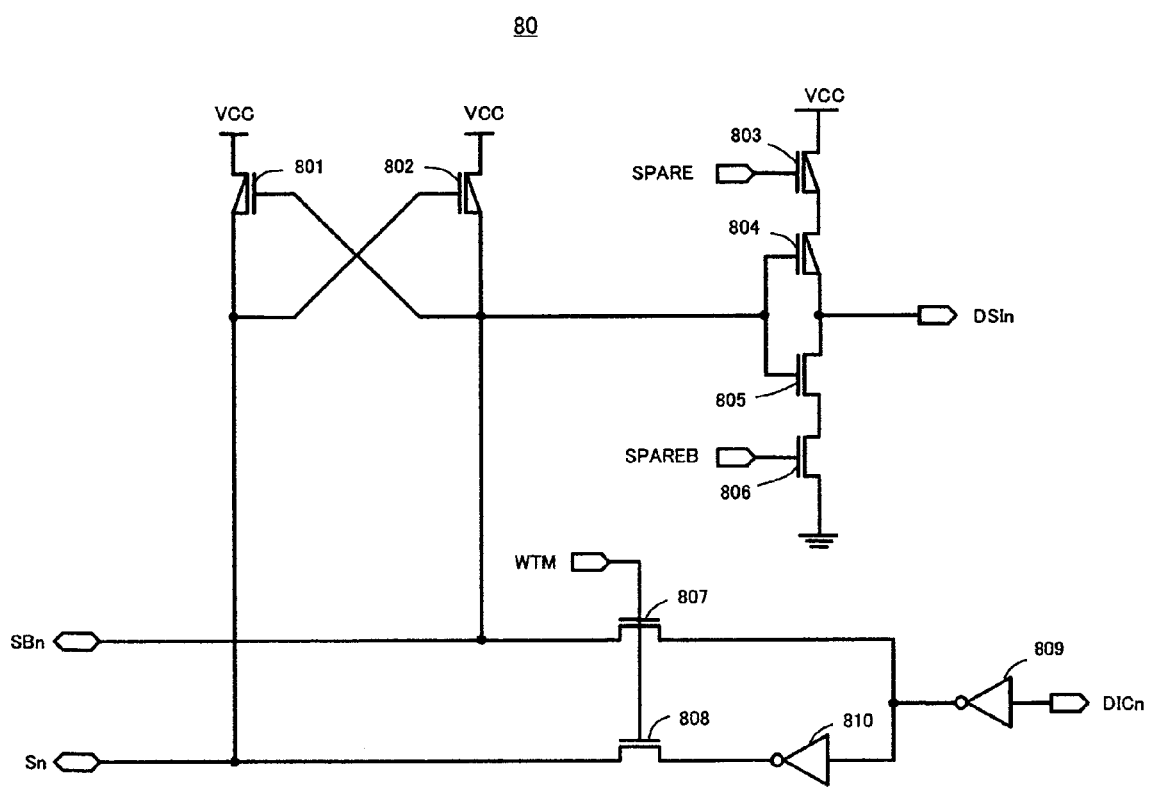
FIG. 8 illustrates an IO_SA(15:0) circuit of FIG. 2 in accordance with the embodiment of the present invention.

FIG. 8 illustrates the IO_SA(15:0) circuit 80 in accordance with the embodiment of the present invention. As shown in FIG. 8, the IO_SA(15:0) circuit 80 includes PMOS transistors 801 through 804, NMOS transistors 805 through 808, and inverters 809 and 810. At the time of reading, the data existing nodes Sn and SBn are amplified and output from a node DSIn to externally therefrom via an inverter. At the time of writing, a signal WTM is set to a High level, and the nodes Sn and SBn are driven with write data that is input from a node DICn.

Figure 9:
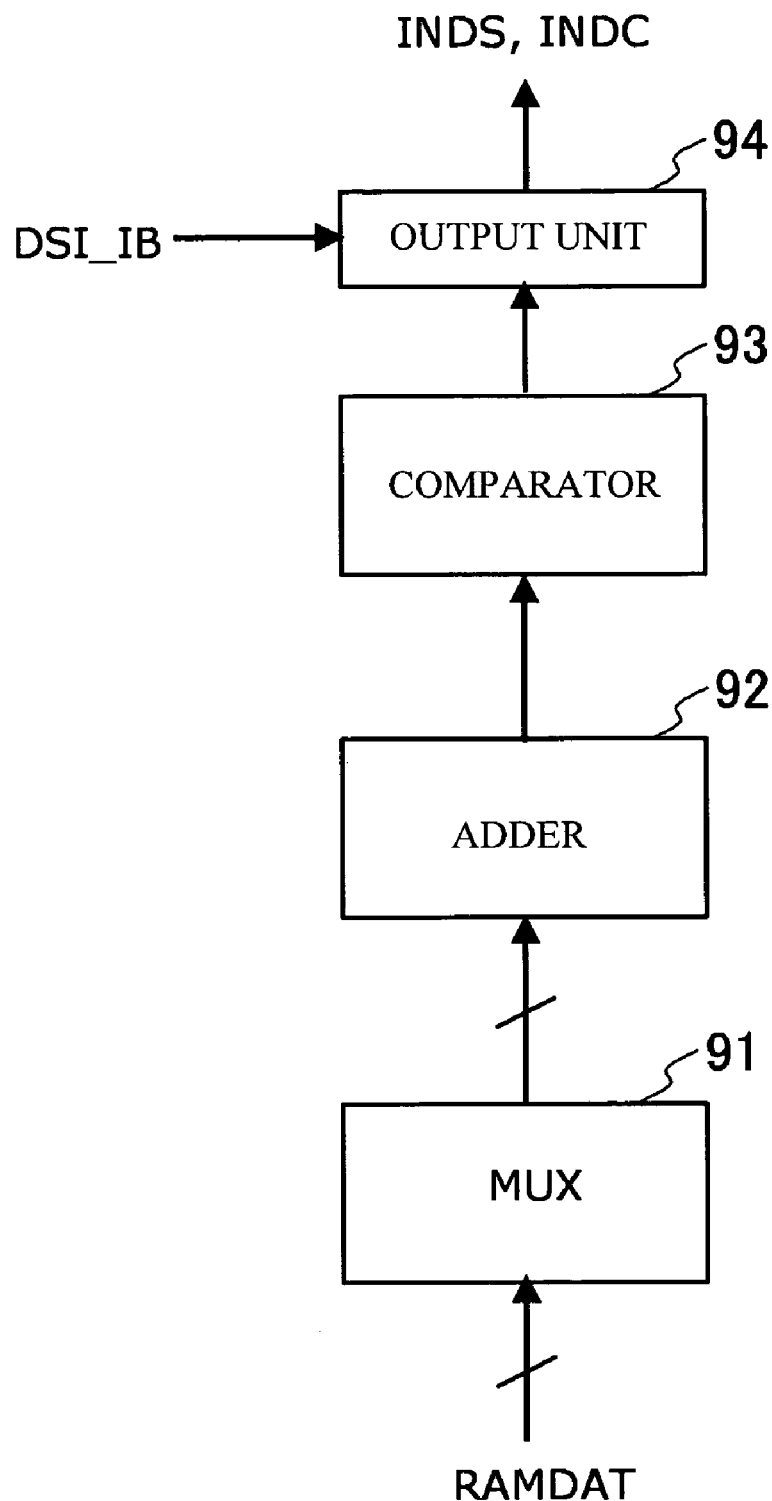
FIG. 9 illustrates a bit detector of FIG. 2 in accordance with the embodiment of the present invention.

FIG. 9 illustrates the bit detector 90 in accordance with the embodiment of the present invention. As shown in FIG. 9, the bit detector 90 includes a MUX 91, an adder 92 that detects the number of bits on which writing is to be actually performed among the first data held in the cache latch circuits 41 at the time of writing, a comparator 93 that compares the number of bits detected by the adder 92 with a predetermined bit number, and an output unit 94 that outputs a flag indicating whether the first data is to be inverted, in accordance with the comparison result of the comparator 93. The bit detector 90 is a circuit that detects the number of "0"s existing on RAMDAT corresponding to the regular data (512 bits) in the regular memory region in the internal access window. So as to reduce current consumption, the internal access window is divided into four windows, for example, and write voltage application is performed with each 134-bit internal write window containing 128 bits of regular data, 1 bit as the indicator bit, 4 bits of spare data, and 1 bit of reference data. If the write data in the regular data (the actual data that is input from external to the flash memory 1 and is stored in the main latch circuits 42) is larger than 64 bits, all 128 bits of signals is inverted and is then written in the core array 2, and a flag is set to the indicator bit IB, is the flag also written in the core array 2. For simplification, the inversion and the non-inversion are not performed on the spare data, but the writing operation may be performed on the spare data, with all the data being objects to be calculated by the bit detector 90.

For example, at the time of writing, if seventy bits of data "0" are set among the main latch circuits 42 of the 128-bit regular data, the data "0" appear on seventy lines of RAMDAT. The adder 92 counts the number of "0"s, and the comparator 93 determines whether the number of "0"s is larger than 64. If it is larger than 64, the output INDC of the comparator 93 is High, and the output INDCB of the comparator 93 is Low. The seventy "0"s on the lines RAMDAT are inverted by the inverting circuit 320 in the WR latch circuit 31 shown in FIG. 5, and the node PDINB is set to a Low level. Accordingly, programming is not performed on the corresponding bits.

Meanwhile, the fifty-eight "1"s on the remaining RAMDAT lines are also inverted in the WR latch circuit 31 and the node PDINB is set to a High level. Thus, programming is performed on the corresponding bits. At the same time, the node PDINB for indicator bits IB in the WR latch circuit 31 is set to a High level. As a result, fifty-eight bits (=128−70)+1 bit in a written state, and 4 bits of spare data at a maximum and 1 bit of reference data in a written state are stored in the WR latch circuit 31. As described above, the number of bits on which programming is to be actually performed is sixty-nine (=64+4+1) at a maximum. Accordingly, the writing time and the write current can be reduced. Four indicator bits IB are provided for each page because the unit for write pulse application (i.e., the write window) is divided into four.

Likewise, at the time of reading, the cell data of the internal access window unit is sensed among the cell data of one page and is output as data DSI to the WR sense amplifier block circuit 30. The data is, of course, the data that is actually written in the cells. The indicator bits IB are sensed at the same time. In a case where the data DSI-IB of one of the four divided indicator bits IB is High, which indicates that the number of "0"s in the regular data is larger than sixty-four and inverted data is written at the time of writing in the subject write window, the output INDS of the output unit 94 of the bit detector 90 becomes High, and the inverting circuit 310 of the WR latch circuit 31 inverts the sensed data existing in the data DSI. In this manner, the sensed data is returned to the original data (the write data that is input from external to the flash memory 1) and is output to the corresponding lines RAMDAT.

If the data of the indicator bit IB is Low, the output INDS becomes Low, and the data DSI is not inverted and is output to the corresponding lines RAMDAT without change. This is repeated for all four divided write windows, so that all the data after the inverting operation for an internal access window is output to the lines RAMDAT. The data appearing on the lines RAMDAT is then transferred to the SRAM array 40. This is repeated thirty-two times so that the read data of one page is stored in the main latch circuits 42 of the SRAM array 40. In this manner, the bit detector 90 detects the data of each write window, instead of the data of an internal access window.

Next, the writing operation is described. First, the write data of one page of external data is written into the cache latch circuits 41 in the SRAM array 40 in a serial fashion through the lines DC via the IO_S/A(0:15) 80, the Y-select 72, and the DC bit-line charge block 60. All the data is then transferred to the main latch circuits 42 via the transfer transistors 43. For more stable operations, the data may be divided with signals TR, and then transferred.

The main latch circuits 42 are accessed for each internal access unit, and the latched data is output from the sense amplifier circuits of the DM bit-line charge/main latch circuits 42 to the lines RAMDAT through the lines DM. The bit detector 90 then counts the number of "0"s in the data. If the size of the write data in the regular data is larger than sixty-four bits, all the signals of one hundred twenty-eight bits are inverted and are then written in the core array 2. At the same time, a flag is set in accordance with the indicator bit IB, and is also written in the core array 2.

Next, the reading operation is described. After sensing, the data of one page is set to the main latch circuits 42 through the lines DM under the control of the bit detector 90. All the data is then transferred to the cache latch circuits 41 through the transfer transistors 43. The data is then externally read out from DSI(15:0) via the DC bit-line charge block 60, the Y-select 72, and the IO_S/A(0:15) 80 through the lines DC. The output is performed by a toggle operation using a RE control signal for each sixteen bits.

Next, the cache program is described. The state machine 3 performs a control operation which loads second data that is input from external to the flash memory 1 into the cache latch circuits 41 during the operation of writing the first data from the main latch circuits 42 into the memory cell array 2 in accordance with the cache program. More specifically, while the write data of one page is being written in cells from external to the flash memory 1, the data held in the main latch circuits 42 is used. However, as the signal TR is at a Low level, the cache latch circuits 41 are separated and are in an unused state. Accordingly, during the writing operation, the data for executing another program can be loaded into the cache latch circuits 41. In this manner, the loading of next data is completed. As the previous programming is completed, the signal TR becomes High and the data for executing the next program is transferred to the main latch circuits 42, thereby initiating the next program.

Figure 10:
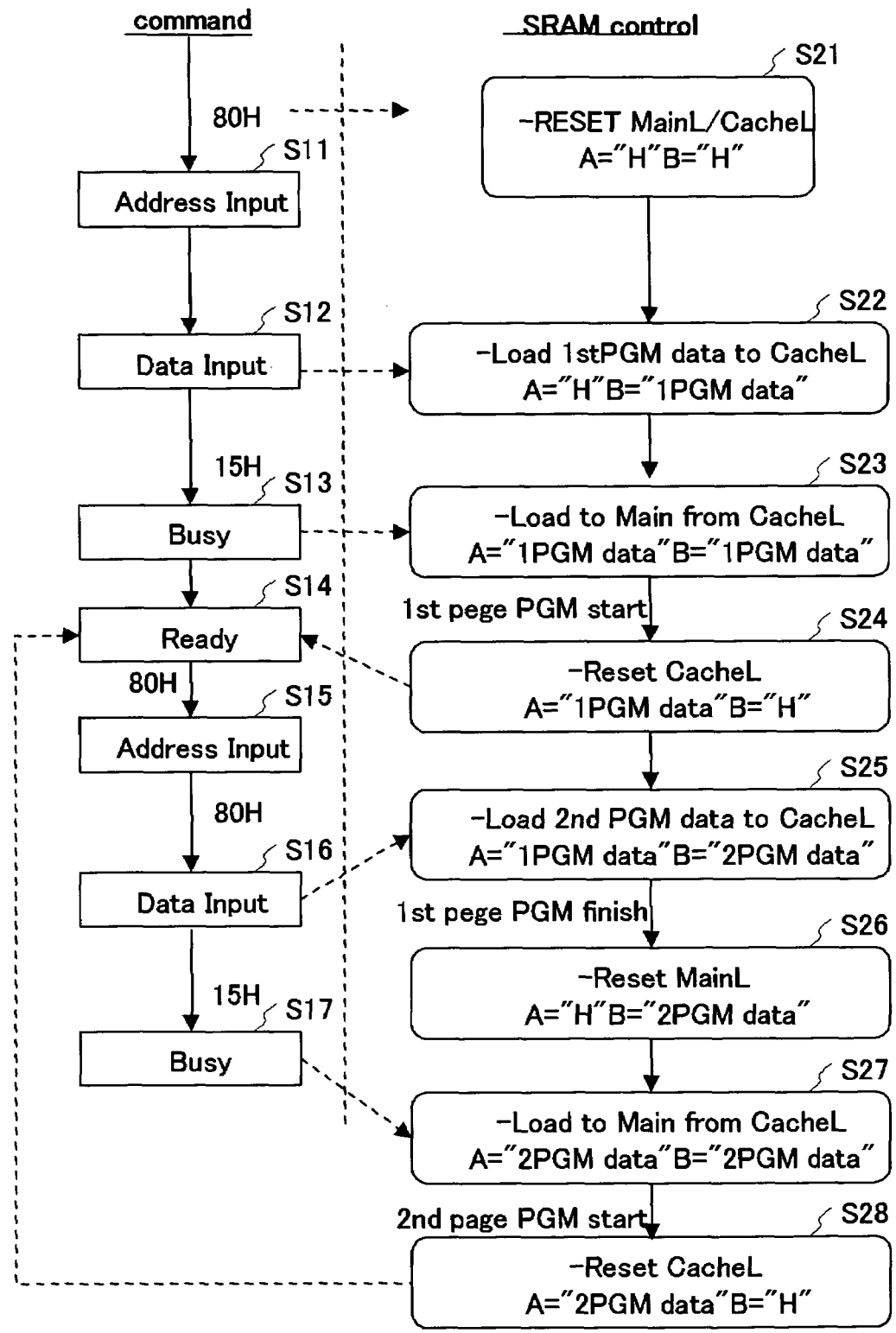
FIG. 10 shows an operation flowchart involving the cache latch circuits and the main latch circuits in accordance with the embodiment of the present invention.

FIG. 10 shows an operation involving the cache latch circuits 41 and the main latch circuits 42 in accordance with the embodiment of the present invention. In FIG. 10, A and B are equivalent to the nodes A and B shown in FIG. 3. When a program command is input, the cache latch circuits 41 and the main latch circuits 42 are reset (S21). After the program entry command 80h is input, the first page address and first program data are sequentially input (S11, S12). The first program data is then loaded into the cache latch circuits 41 (S22). A command 15h to perform cache programming is then input. As a result, RD/BY becomes Low (a busy state, S13), and the first program data is transferred from the cache latch circuits 41 to the main latch circuits 42 (S23). The cache latch circuits 42 are then reset (S24).

When RD/BY returns to a High level (a ready state, S14), the internal writing of the first program data is started, and the next data (the second program data) and the second page address become ready to be input (S15, S16). The second program data is then loaded into the cache latch circuits 41 (S25). If the previous first programming is complete, the main latch circuits 42 are reset (S26). As a result, RD/BY becomes Low (a busy state, S17), and the second program data is transferred from the cache latch circuit 41 to the main latch circuit 42 (S27). Accordingly, second programming is started and the cache latch circuits 41 are reset (S28). In a like manner, the third programming and the fourth programming are performed. If the fourth program is the last program to be executed, a command 10h is input, instead of the command 15h, and the operation comes to an end.

Figure 11:
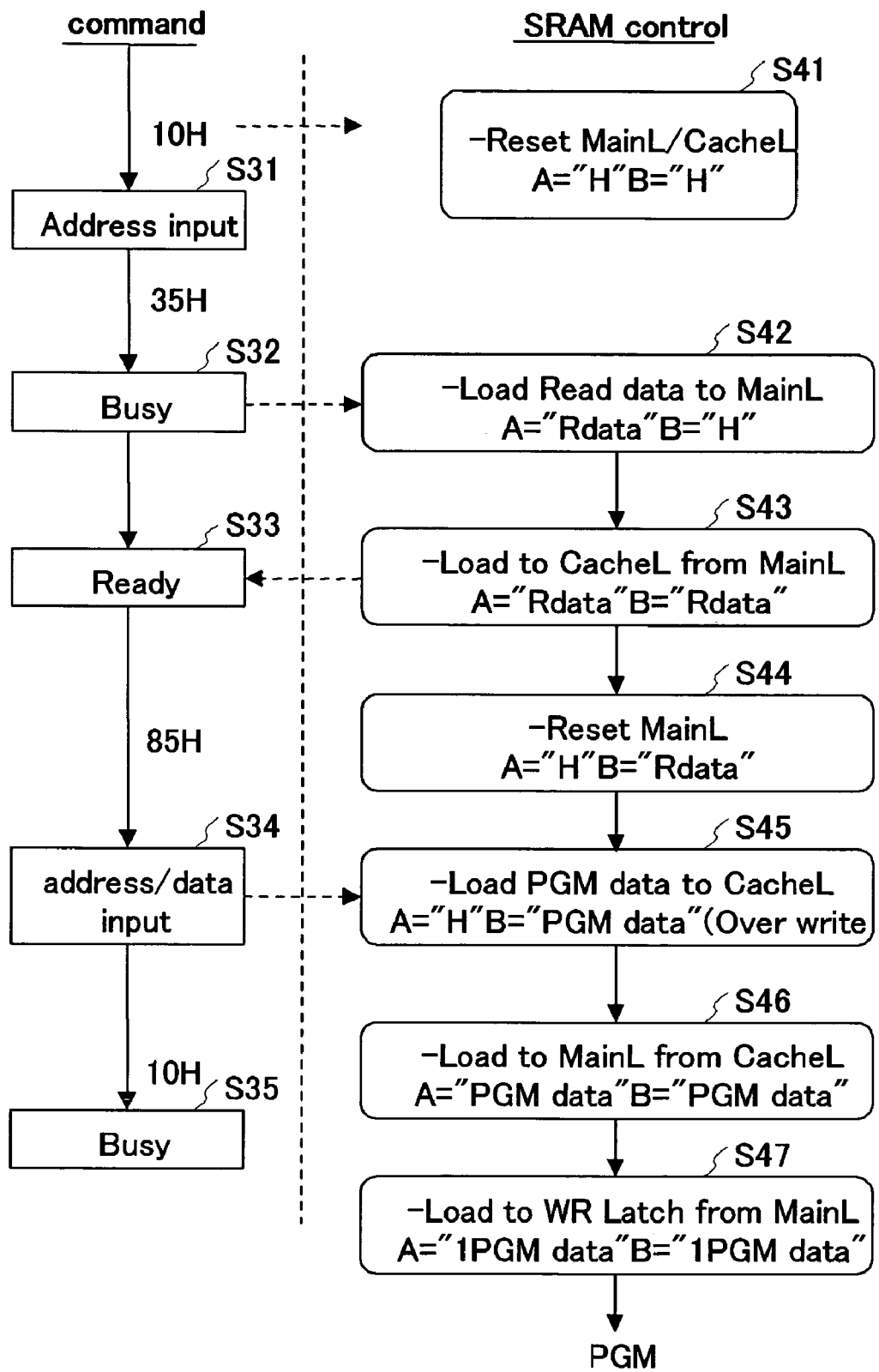
FIG. 11 shows another operation flowchart involving the cache latch circuits and the main latch circuits in accordance with the embodiment of the present invention.

A copy-back operation is next described referring to FIG. 11. FIG. 11 shows another operation flowchart in accordance with the embodiment of the present invention involving the cache latch circuits 41 and the main latch circuits 42. Using the cache latch circuits 41 and the main latch circuits 42, the state machine 3 performs a control operation to overwrite the read data that is read out from the memory cell array 2 with write data that is input from external to the flash memory 1, and the overwritten data is written into the memory cell array 2. More specifically, a read command 10h and the page address (the source address) of the original to be copied are first input (S31). The cache latch circuits 41 and the main latch circuits 42 are reset (S41). As a command 35h is input (S32), the cells of one page at the source address are internally read into the main latch circuits 42 (S42). Next, the data prior to inversion (if not inverted, the current data) are written into the main latch circuits 42 under the control of the bit detector 90, as described above. The data written into the main latch circuits 42 is then transferred to the cache latch circuits 41 (S43). The main latch circuits 42 are then reset (S44).

Until then, RD/BY is at a Low level. When the RD/BY signal returns to a High level (S33) after the transfer, the page address (the destination address) of the copy destination is input. If a change is to be made to the original data (or overwrite is to be performed), overwrite data is input from external to the flash memory 1 (S34), following the address input. If there is a bit to which a change is to be made among the data set to the cache latch circuits 41, the external data is overwritten (S45). When the overwrite is completed, the signal TR is set to a High level, so that the data in the cache latch circuits 41 is transferred to the main latch circuits 42 (S46).

As a program command 10h is input (S35), the data is transferred from the main latch circuits 42 to the WR latch circuit 31 (S47) and programming (copying) is performed at the new page address. If no changes are to be made to the original data, the program command 10*h* is input, following the destination address input. A simple copying operation is then performed in response thereto.

Although the over-writable copy-back operation has been described, it is also possible to perform a copy-back operation not involving overwrite. In such an operation, the state machine 3 uses the cache latch circuits 41 and the main latch circuits 42 to perform such a control operation that the data read out from the memory cell array 2 is written in other regions in the memory cell array 2.

Although a few preferred embodiments of the present invention have been shown and described, it would be appreciated by those skilled in the art that changes may be made in these embodiments without departing from the principles and spirit of the invention, the scope of which is defined in the claims below and their equivalents.

What is claimed is:

1. A semiconductor device comprising:
   a non-volatile memory cell array;
   a write/read circuit writing data into and reading data from the non-volatile memory cell array;
   a data input/output circuit; and
   a volatile memory cell array including a first latch circuit that is connected to the write/read circuit and latches first data, and a second latch circuit that is connected to the data input/output circuit and latches second data.

2. The semiconductor device as claimed in claim 1, further comprising an inverter circuit that inverts the first data in accordance with the number of bits to be actually written among the first data at the time of writing.

3. The semiconductor device as claimed in claim 2, further comprising a control circuit that controls the second latch circuit to latch the second data while the non-volatile memory cell array is being programmed with the first data.

4. The semiconductor device as claimed in claim 1, further comprising a control circuit that controls the second latch circuit to latch the second data while the non-volatile memory cell array is being programmed with the first data.

5. The semiconductor device as claimed in claim 1, further comprising a control circuit that performs a control operation using the first and second latch circuits to store data read from the non-volatile memory cell array in another area in the non-volatile memory cell array.

6. The semiconductor device as claimed in claim 1, further comprising a control circuit that performs a control operation using the first latch circuit and the second latch circuit to overwrite data that is read out from the non-volatile memory cell array with write data that is supplied from external thereto, and to write the overwritten data into the non-volatile memory cell array.

7. The semiconductor device as claimed in claim 2, further comprising:
   a detection circuit that detects the number of bits to be written among the first data in writing;
   a comparator circuit that compares the number of bits detected by the detection circuit with a given number of bits; and
   an output circuit that outputs a flag indicating whether the first data should be inverted on the basis of a comparison result by the comparator circuit.

8. The semiconductor device as claimed in claim 2, wherein the non-volatile memory cell array has a region that stores a flag indicating whether the first data has been inverted and written into the non-volatile memory cell array in accordance with the number of bits to be actually written among the first data in writing.

9. The semiconductor device as claimed in claim 2, further comprising an inverting circuit that inverts data read from the non-volatile memory cell array during reading in accordance with a flag indicating whether the first data has been inverted and written in accordance to the number of bits to be actually written among the first data at the time of reading.

10. The semiconductor device as claimed in claim 1, wherein the volatile memory cell array further comprises a sense amplifier circuit for precharging a bit line in the first latch circuit.

11. The semiconductor device as claimed in claim 1, wherein the volatile memory cell array further comprises a sense amplifier circuit for precharging a bit line in the second latch circuit.

12. The semiconductor device as claimed in claim 1, further comprising a decoder that is associated with the volatile memory cell array.

13. The semiconductor device as claimed in claim 1, wherein the volatile memory cell array further comprises a switch for controlling data transfer between the first latch circuit and the second latch circuit.

14. The semiconductor device as claimed in claim 13, wherein, prior to data transfer between the first latch circuit and the second latch circuit, the first latch circuit or the second latch circuit, whichever is a transfer destination, is reset to a predetermined state.

15. The semiconductor device as claimed in claim 1, wherein the first latch circuit and the second latch circuit in the volatile memory cell array are equivalent to one page.

16. The semiconductor device as claimed in claim 2, wherein the volatile memory cell array includes a region for storing a flag indicating whether the first data has been inverted and written in accordance with the number of bits to be actually programmed among the first data at the time of writing.

17. The semiconductor device as claimed in claim 1, wherein the volatile memory is an SRAM.

18. The semiconductor device as claimed in claim 1, wherein the non-volatile memory cell array includes a SONOS-type cell.

19. The semiconductor device as claimed in claim 1, wherein the non-volatile memory cell array includes a cell to be programmed through hot electron injection.

20. A method of controlling a semiconductor device, comprising the steps of:
    loading first data into a first latch circuit in a volatile memory cell array;
    inverting the first data in accordance with the number of bits to be actually programmed among the first data;
    writing the inverted data into a non-volatile memory cell array; and
    loading second data into a second latch circuit in the volatile memory cell array.

21. The method as claimed in claim 20, further comprising the step of
    inverting the first data in accordance with the number of bits to be actually programmed among the first data at the time of writing.

22. The method as claimed in claim 20, wherein the second data is loaded into the second latch circuit while the non-volatile memory cell array is being programmed with the first data.

23. The method as claimed in claim 20, further comprising the step of writing data that is read out from a region in the non-volatile memory cell array into another region in the non-volatile memory cell array, using the first latch circuit and the second latch circuit.

24. The method as claimed in claim 20, further comprising the step of overwriting data that is read out from the non-volatile memory cell array with write data that is supplied from outside, and writing the overwritten data into the non-volatile memory cell array.

25. The method as claimed in claim 20, further comprising the steps of:

dividing the first data;

detecting the number of bits to be actually programmed among the divided data; and outputting a flag indicating whether the first data is to be inverted in accordance with the detected number of bits.

26. The method as claimed in claim 20, further comprising the step of inverting data that is read out from the non-volatile memory cell array in accordance with the number of bits to be programmed.

* * * * *